(12) United States Patent
Thiery

(10) Patent No.: US 7,327,546 B2
(45) Date of Patent: Feb. 5, 2008

(54) POWER SWITCHING CIRCUIT WITH ACTIVE CLAMP DISCONNECT FOR LOAD DUMP PROTECTION

(75) Inventor: Vincent Thiery, La Roque d'Antheron (FR)

(73) Assignee: International Rectifier Corporation, El Segundo, CA (US)

(*) Notice: Subject to any disclaimer, the term of this patent is extended or adjusted under 35 U.S.C. 154(b) by 534 days.

(21) Appl. No.: 10/888,095

(22) Filed: Jul. 8, 2004

(65) Prior Publication Data

US 2006/0006851 A1 Jan. 12, 2006

(51) Int. Cl.
*H02H 7/00* (2006.01)
(52) U.S. Cl. .................................................... 361/100
(58) Field of Classification Search .................. 361/100
See application file for complete search history.

(56) References Cited

U.S. PATENT DOCUMENTS 6,087,877 A    7/2000  Gonda et al. ............... 327/309

7,015,681 B2 *  3/2006  Thiery ........................ 323/276
2005/0189965 A1  9/2005  Tihanyi ....................... 327/108

FOREIGN PATENT DOCUMENTS

DE    10 2004 007 208 B3    5/2005

* cited by examiner

*Primary Examiner*—Stephen W. Jackson
(74) *Attorney, Agent, or Firm*—Ostrolenk, Faber, Gerb & Soffen, LLP

(57) ABSTRACT

A power switching circuit supplying electrical power to a load comprising a power MOSFET semiconductor switch having a gate electrode and two main current carrying electrodes and a back biased body zener diode, an active clamp for clamping a voltage between one of the main current carrying electrodes provided with a supply voltage and the gate electrode at a first specified voltage when the supply voltage increases beyond a predetermined voltage; and a circuit for disconnecting the active clamp when the supply voltage increases a predetermined amount above the predetermined voltage, allowing the body zener diode to avalanche at a second specified voltage that is greater than the first specified voltage thereby to clamp the voltage across the power semiconductor switch.

5 Claims, 3 Drawing Sheets

POWER SWITCHING CIRCUIT WITH ACTIVE CLAMP DISCONNECT FOR LOAD DUMP PROTECTION

BACKGROUND OF THE INVENTION

The present invention relates to power switching circuits, and in particular, to power MOSFET switching circuits, and more particularly, to circuits for protecting such power MOSFETs and their drivers from the effects of load dumps.

Load dumps are relatively slow voltage surges which occur on power supplies. In automotive applications, such load dumps may occur when the automotive storage battery becomes temporarily disconnected from the supply. In such instances, a slow voltage surge may occur on the supply voltage line which can damage the power switches and their driver circuits. For example, in a typical automotive application, which has a supply voltage of approximately 14 volts, a load dump of 3 to 6 times the normal supply voltage can occur.

FIG. 1 shows a typical prior art switching circuit. A power MOSFET switch 10 includes main current carrying cells 10A, a reverse polarized body zener diode 10B and current sense cells 10C that are part of the FET and are used to determine the current through the FET and for providing a feedback signal VFB. The current is determined across a sense resistor RS.

A gate drive signal on line 11 is provided to the gate of the power FET 10 which is coupled in series with the load 20, which might comprise, for example, a motor. The FET 10 and the motor 20 are coupled between the supply voltage VDD and power ground. A low side switch 12 may also be provided, driven by another gate drive signal out of phase with the gate drive signal on line 11 in some applications.

The circuit of FIG. 1 includes an active clamp comprising, in its simplest form, zener diode DZ, optionally diode D1 and optionally resistor RA. If the voltage VDD increases beyond the normal supply voltage, and if the voltage VDD increases beyond the avalanche voltage VZ of zener diode DZ, the gate voltage to FET 10 will be clamped at a voltage approximately VZ below VDD. This is shown graphically in FIG. 1A which shows the voltage VDD increasing beyond the clamp voltage of approximately 30 volts. When VDD increases beyond 30 volts, the output across the clamp (measured between VDD and the clamp output) is clamped to the clamp voltage of 30V.

FIG. 1B shows another implementation of the clamp circuit in which a transistor Q1 functioning as an emitter-follower is turned on when diode DZ avalanches. When transistor Q1 turns on when diode DZ conducts at its avalanche voltage, a voltage is produced across resistor RB clamping the gate of FET 10 at a voltage V clamp of approximately VZ plus the forward drops of diode D1 and VBE of transistor Q1.

Clamping of the gate voltage will prevent damage to the FET and its driver circuits in the event of a load dump.

The problem with this circuit is that the power MOSFET 10 may be overheated if $V_{out} > V_z$ plus about 2 volts (due to load dump) and power switch 10 may be damaged. At voltages VDD between 35 volts and approximately 60 to 70 volts, the driver and switch are still adequately protected by this circuit. However, at VDD voltages above approximately 75 volts, the switch 10 may be damaged because the clamp circuit is incapable of providing adequate voltage protection to the gate of FET 10. To solve this problem, FETS and drivers having higher reverse voltage ratings are necessary using the prior art circuit or expensive zener diodes are disposed across the supply voltage.

SUMMARY OF THE INVENTION

Accordingly, is an object of the present invention to provide a circuit for providing protection to the gate drive circuits and power switches during load dumps.

The above and other objects of the invention are achieved by a power switching circuit supplying electrical power to a load comprising a power MOSFET semiconductor switch having a gate electrode and two main current carrying electrodes and a back biased body zener diode, an active clamp for clamping a voltage between one of the main current carrying electrodes provided with a supply voltage and the gate electrode at a first specified voltage when the supply voltage increases beyond a predetermined voltage; and a circuit for disconnecting the active clamp when the supply voltage increases a predetermined amount above the predetermined voltage, allowing the body zener diode to avalanche at a second specified voltage that is greater than the first specified voltage thereby to clamp the voltage across the power switch.

The above objects of the invention are also achieved by a method of protecting a power semiconductor switching circuit against load dumps on a supply voltage to a power semiconductor MOSFET switch of the power semiconductor switching circuit, the method comprising providing a power MOSFET semiconductor switch having a gate electrode and two main current carrying electrodes and a back biased body zener diode, clamping a voltage between one of the main current carrying electrodes provided with a supply voltage and the gate electrode at a first specified voltage when the supply voltage increases beyond a predetermined voltage; and disconnecting the active clamp when the supply voltage increases a predetermined amount above the predetermined voltage, allowing the body zener diode to avalanche at a second specified voltage that is greater than the first specified voltage to clamp the voltage across the power semiconductor switch.

Other features and advantages of the present invention will become apparent from the following description of the invention which refers to the accompanying drawings.

BRIEF DESCRIPTION OF THE DRAWING(S)

The invention will be described in greater detail in the following detailed description with reference to the drawings in which.

DETAILED DESCRIPTION OF THE INVENTION

Figure 2:
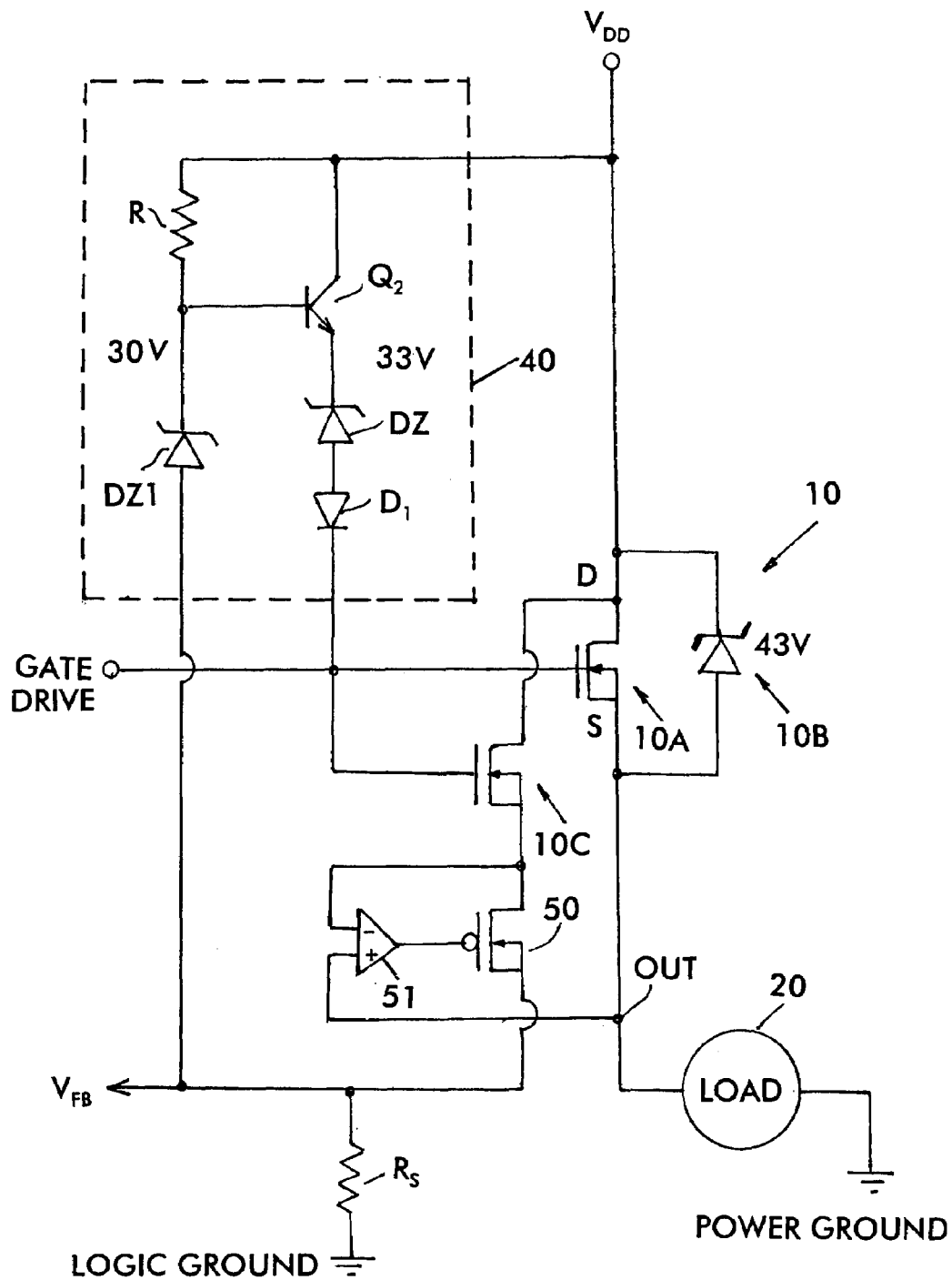
FIG. 2 shows a power switching circuit having load dump protection circuitry according to the present invention.

With reference again to the drawings, FIG. 2 shows a power switching circuit incorporating a load dump protection circuit according to the present invention. The circuit includes power switch 10, comprising main current carrying cells 10A, body zener diode 10B and current sense cell 10C. The load is again indicated at 20.

Figure 1:
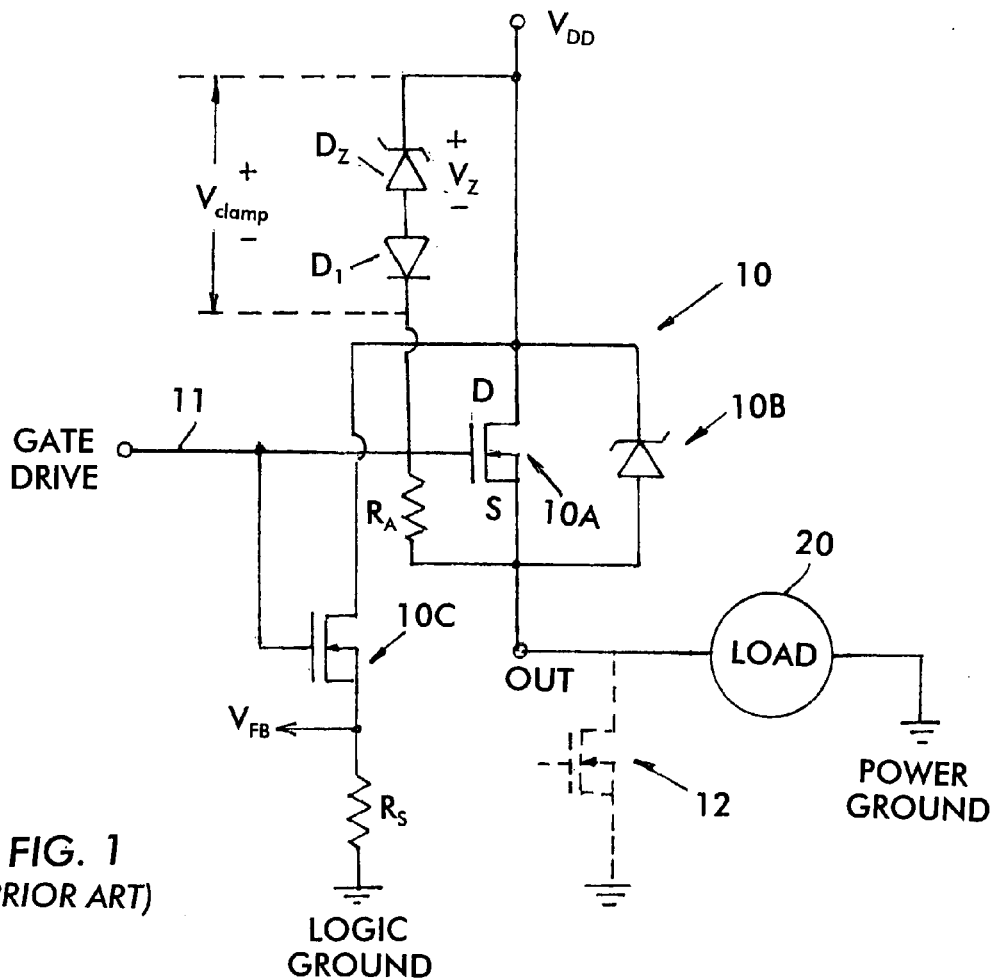
FIG. 1 shows a prior art power switching circuit with an active clamp.
Figure 1A:
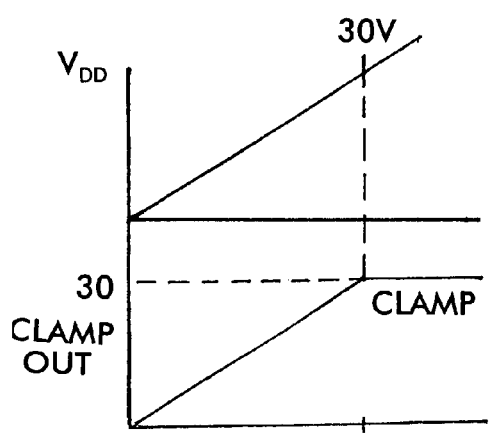
FIG. 1A shows waveforms useful in explaining the circuit of FIG. 1.
Figure 1B:
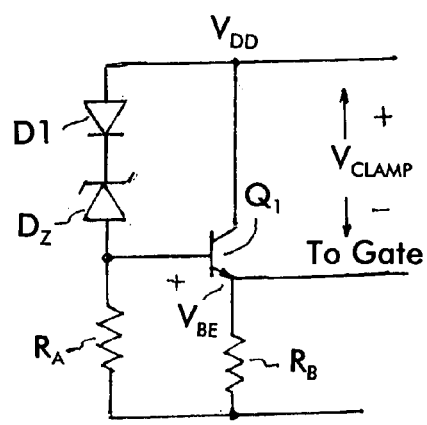
FIG. 1B shows an alternative embodiment of an active clamp.

The circuit of FIG. 2 includes an active clamp and disconnect circuit 40. The active clamp comprises the zener diode DZ, as well as optionally diode D1. The active clamp comprising DZ and D1 may be replaced by the circuit of FIG. 1B. The circuit also includes an active disconnect circuit comprising a transistor Q2, resistor R, and a second zener diode DZ1.

In addition, also shown in FIG. 2 is a more elaborate current sense feedback circuit including FET 50 and a comparator 51. As in the circuit of FIG. 1, the transistor cell or cells 10C is utilized to provide a current sense through resistor RS. Comparator 51 compares the output voltage at OUT to the voltage at the source of transistor sense cell 10C. Should the output voltage drop because of excessive current, the output of comparator 51 will go low, turning on transistor 50 and providing a feedback VFB signal developed across resistor RS.

Figure 3:
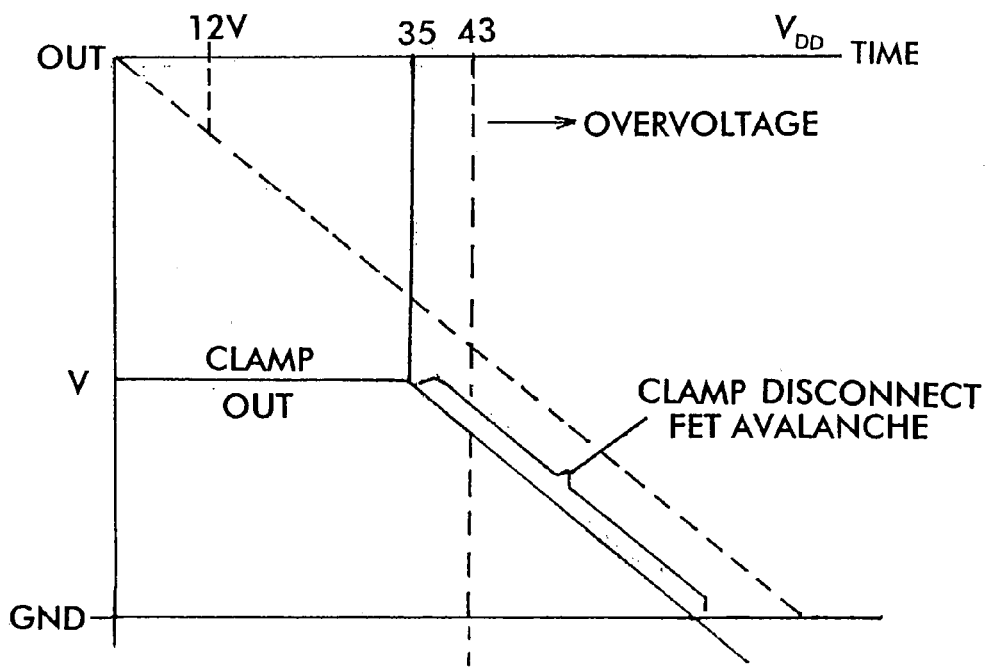
FIG. 3 shows graphs useful in explaining the operation of the circuit of FIG. 2.
Figure 4:
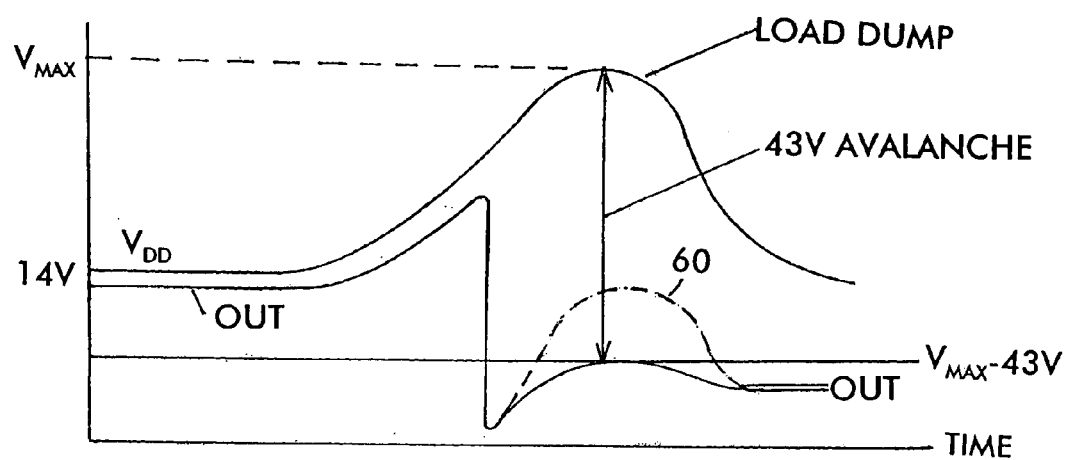
FIG. 4 shows further waveforms for explaining the operation of the circuit of FIG. 2.

Turning to the active clamp and disconnect circuit 40, the clamp circuit operates to clamp the gate voltage of transistor 10A (measured with respect to VDD) at voltages VDD above about 35 volts to the active clamp voltage, here about 35 volts below VDD, as determined by DZ and D1. At voltages VDD below 35 volts, zener diode DZ1 is not conducting and transistor Q2 has a positive base emitter voltage. The zener diode DZ is not conducting as it has not reached its avalanche voltage. As VDD increases during a load dump, as shown in FIG. 3, zener diode DZ1 will avalanche when its zener voltage (here 30V) has been reached. This will maintain the base of transistor Q2 at approximately 30 volts plus the voltage drop across resistor RS above logic ground. If the voltage at the base of Q2 exceeds the emitter voltage of Q2, which is approximately 33.7 volts as determined by zener diode DZ plus the diode drop of diode D1 above the gate voltage, transistor Q2 will remain in conduction. However, when the base voltage drops below the emitter voltage, transistor Q2 goes off, disconnecting the active clamp. When the active clamp disconnects, as shown in FIG. 3, at about 35 volts, the FET 10A turns off in the absence of a gate drive as shown in FIG. 4. It is only when a gate drive is not present and transistor 10A is off that the load dump can adversely damage the driver and power switch. Once the active clamp disconnects, then the internal body diode 10B of the transistor 10A will avalanche when the drain source voltage exceeds approximately 43 volts, the avalanche voltage of the body diode 10B. This is shown illustratively in FIG. 4 which shows the voltage OUT being clamped at approximately 43 volts below the peak VMAX of the load dump present on VDD. The dashed line 60 in FIG. 3 show the output voltage OUT if the clamp disconnect circuitry were not provided.

The invention has an important benefit in that power switch 10 can be replaced by a less expensive switch having a lower voltage rating. For high current protection, an active clamp is required. It should be around 8V below the MOSFET body diode to take into account body diode and clamp zener dispersion. To pass a 43V load dump, the active clamp must be about 40V (the 3V difference will be absorbed by the load dump series resistance (approximately 6 A for a 43V 0.50 Ohm specified load dump) so a 48V minimum avalanche rating is required for the power MOSFET.

With the present invention the active clamp is disconnected so that a 40V MOSFET can be used instead resulting in smaller silicon area for same $R_{DSON}$. It is safe to disconnect the active clamp during a load dump since the current is small.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A power switching circuit supplying electrical power to a load comprising:
   a power MOSFET semiconductor switch having a gate electrode and two main current carrying electrodes and a back biased body zener diode;
   an active clamp for clamping a voltage between one of the main current carrying electrodes provided with a supply voltage and the gate electrode at a first specified voltage when the supply voltage increases beyond a predetermined voltage; and
   a circuit for disconnecting the active clamp when the supply voltage increases a predetermined amount above the predetermined voltage, allowing the body zener diode to avalanche at a second specified voltage that is greater than the first specified voltage thereby to clamp the voltage across the power semiconductor switch.

2. The power switching circuit of claim 1, wherein the circuit for disconnecting the active clamp comprises:
   a transistor connected in series with the active clamp having a control electrode;
   a series circuit comprising a resistor and a first zener diode, the resistor and first zener diode being connected across the supply voltage; and
   the control electrode of the transistor being connected to a common connection of the first zener diode and resistor, such that at the predetermined amount above the predetermined voltage, the transistor is turned off, thereby disconnecting the active clamp from providing a clamped voltage to the power semiconductor switch.

3. The power switching circuit of claim 2, wherein the active clamp comprises a second zener diode.

4. The power switching circuit of claim 3, wherein the active clamp further comprises a second transistor coupled as an emitter-follower to the second zener diode for providing a clamped voltage to the gate electrode of the power semiconductor switch with respect to the supply voltage.

5. A method of protecting a power semiconductor switching circuit against load dumps on a supply voltage to a power semiconductor MOSFET switch of the power semiconductor switching circuit, the method comprising:
   providing a power MOSFET semiconductor switch having a gate electrode and two main current carrying electrodes and a back biased body zener diode;
   clamping a voltage between one of the main current carrying electrodes provided with a supply voltage and the gate electrode at a first specified voltage when the supply voltage increases beyond a predetermined voltage; and
   disconnecting the active clamp when the supply voltage increases a predetermined amount above the predetermined voltage, allowing the body zener diode to avalanche at a second specified voltage that is greater than the first specified voltage to clamp the voltage across the power semiconductor switch.

* * * * *